US009449632B2

(12) United States Patent
Irisawa et al.

(10) Patent No.: US 9,449,632 B2
(45) Date of Patent: Sep. 20, 2016

(54) METHOD FOR MANUFACTURING MAGNETIC RECORDING MEDIUM, AND MAGNETIC RECORDING/REPRODUCING APPARATUS

(75) Inventors: Toshikazu Irisawa, Kawasaki (JP); Atsushi Hashimoto, Chiba (JP)

(73) Assignee: SHOWA DENKO K.K., Tokyo (JP)

( * ) Notice: Subject to any disclaimer, the term of this patent is extended or adjusted under 35 U.S.C. 154(b) by 70 days.

(21) Appl. No.: 13/432,931

(22) Filed: Mar. 28, 2012

(65) Prior Publication Data

US 2012/0250186 A1 Oct. 4, 2012

(30) Foreign Application Priority Data

Mar. 30, 2011 (JP) ................................. 2011-074303

(51) Int. Cl.
| | |
|---|---|
| C23C 14/34 | (2006.01) |
| G11B 5/73 | (2006.01) |
| C23C 14/00 | (2006.01) |
| C23C 14/16 | (2006.01) |
| C30B 23/02 | (2006.01) |
| C30B 29/52 | (2006.01) |
| G11B 5/65 | (2006.01) |
| G11B 5/66 | (2006.01) |
| C30B 23/00 | (2006.01) |
| G11B 5/851 | (2006.01) |

(52) U.S. Cl.
CPC ......... *G11B 5/7325* (2013.01); *C23C 14/0036* (2013.01); *C23C 14/0042* (2013.01); *C23C 14/165* (2013.01); *C30B 23/002* (2013.01); *C30B 23/025* (2013.01); *C30B 29/52* (2013.01); *G11B 5/656* (2013.01); *G11B 5/66* (2013.01); *G11B 5/851* (2013.01)

(58) Field of Classification Search
CPC ....................... C23C 14/0036; C23C 14/0042
See application file for complete search history.

(56) References Cited

U.S. PATENT DOCUMENTS

2005/0186450 A1* 8/2005 Takenoiri et al. ............ 428/827

FOREIGN PATENT DOCUMENTS

| | | |
|---|---|---|
| CN | 1625769 A | 6/2005 |
| CN | 1648997 A | 8/2005 |

(Continued)

OTHER PUBLICATIONS

Chinese Office Action issued in application No. 201210086440.4 dated Jul. 31, 2014.

(Continued)

*Primary Examiner* — Jason M Berman
(74) *Attorney, Agent, or Firm* — Sughrue Mion, PLLC (57) ABSTRACT

A method for manufacturing a magnetic recording medium including at least a non-magnetic substrate, a soft magnetic underlayer, an orientation control layer that controls an orientation of an immediate upper layer, and a perpendicular magnetic layer in which a magnetization easy axis is mainly perpendicularly oriented with respect to the non-magnetic substrate so as to be laminated one another on the non-magnetic substrate. The perpendicular magnetic layer includes two or more magnetic layers, and each layer is subjected to a crystal growth such that each crystal grain composing each magnetic layer forms a columnar crystal continuous in a thickness direction together with the crystal grains composing the orientation control layer. The orientation control layer, formed of a Co—Cr alloy, is formed by the reactive sputtering using a mixture of a sputtering gas and nitrogen.

7 Claims, 7 Drawing Sheets

(56) References Cited

FOREIGN PATENT DOCUMENTS

| | | |
|---|---|---|
| CN | 101252001 A | 8/2008 |
| CN | 101882445 A | 11/2010 |
| JP | 7-244831 A | 9/1995 |
| JP | 2002-358618 A | 12/2002 |
| JP | 2004-22138 A | 1/2004 |
| JP | 2004-310910 A | 11/2004 |
| JP | 2005-276410 A | 10/2005 |
| JP | 2007-272990 A | 10/2007 |
| JP | 2009-116930 A | 5/2009 |
| JP | 2010-176782 A | 8/2010 |

OTHER PUBLICATIONS

Japanese Office Action dated Nov. 18, 2014 issued in application No. 2011-074303.

* cited by examiner

METHOD FOR MANUFACTURING MAGNETIC RECORDING MEDIUM, AND MAGNETIC RECORDING/REPRODUCING APPARATUS

CROSS REFERENCE TO RELATED APPLICATIONS

This application claims priority based on Japanese Patent Application Nos. 2011-074303 filed Mar. 30, 2011, the contents of which are incorporated herein by reference in their entirety.

BACKGROUND OF THE INVENTION

1. Field of the Invention

The present invention relates to a method for manufacturing a magnetic recording medium, and a magnetic recording/reproducing apparatus.

2. Description of the Related Art

Recording density of a hard disk drive (HDD), which is a kind of a magnetic recording/reproducing apparatus, has increased at an annual rate of more than 50% and this tendency is believed to continue into the future. In line with that, a magnetic recording medium suitable for a higher recording density has been developed.

The magnetic recording medium installed in the presently available magnetic recording/reproducing apparatus is a so-called perpendicular magnetic recording medium in which a magnetization easy axis is mainly perpendicularly oriented in a magnetic film. The perpendicular magnetic recording medium is hardly susceptible to a demagnetizing field at a boundary area between recording bits when the perpendicular magnetic recording medium is developed to have a higher recording density, resulting in the realization of a clear formation of a bit boundary. As a result thereof, an increase of noise can be suppressed. Further, as the perpendicular magnetic recording medium is developed to have the higher recording density, a smaller decrease in volume of the recording bit is required. Therefore, the perpendicular magnetic recording medium is resistant to a thermal fluctuation effect. In view of the above, the perpendicular magnetic recording medium has recently attracted a great deal of attention and a medium structure suitable for the perpendicular magnetic recording has been proposed.

To meet with a requirement of realizing the higher recording density of the magnetic recording medium, it has been studied to use a single-pole type head excellent in write-in performance with respect to a perpendicular magnetic layer. In order to work with the single-pole type head, a magnetic recording medium is proposed in which a layer, a so-called backing layer, made of a soft magnetic material is provided between a perpendicular magnetic layer as a recording layer and a non-magnetic substrate, thereby improving the efficiency in input and output of magnetic flux between the single-pole type head and the magnetic recording medium.

However, merely by providing the backing layer in the above-described perpendicular magnetic recording medium, satisfactory results cannot be obtained in recording/reproducing characteristics upon recording and reproducing, thermal fluctuation tolerance, and recording resolution. Therefore, a perpendicular magnetic recording medium excellent in these characteristics is demanded.

More specifically, in order to realize a higher recording density, it is essential to satisfy the demands of both a higher signal-to-noise (S/N) ratio and an improvement of the thermal fluctuation tolerance, wherein the higher S/N ratio refers to make the ratio between a signal and noise upon reproduction greater, and the S/N ratio is an important recording/reproducing characteristic. However, since the two demands above conflict with each other, if one of them is satisfied, the other one becomes unsatisfactory, and thus it is important task to satisfy both demands at a high level.

To solve the above-described problem, proposed is a magnetic recording medium characterized in that 3 magnetic layers are coupled to each other through Anti-Ferro Coupling (AFC) by using a non-magnetic layer and the like, thereby preventing lowering of the S/N ratio while retaining an advantage of lowering the composite Mrt and PW 50 (See, Patent Document 1).

On the other hand, in order to improve the recording/reproducing characteristics and the thermal fluctuation characteristics of the perpendicular magnetic recording medium, proposed is a technique in which an orientation control layer is used to form a multi-layered magnetic layer and a crystal grain of each magnetic layer is formed into a continuous columnar crystal, thereby improving a vertical orientation of the magnetic layers (See, Patent Document 2).

Further, proposed is a technique in which an orientation control layer is formed by a sputtering process using high pressure gas (See, Patent Document 3). Further, in order to further improve the orientation of Ru used as an orientation control layer, proposed is a technique such that the orientation control layer is formed into a double-layered structure, in which an initial layer is formed under low gas pressure and a surface layer is formed under gas pressure higher than the gas pressure used in forming the initial layer (See, Patent Document 4).

It is known that, since a dome-like convex part is formed on a top part of the columnar crystal, the Ru has an effect in a growing crystal grain of the magnetic layer or the like on the convex part and promoting separation of the grown crystal grain to isolate it, thereby growing a magnetic particle into a column shape (See, Patent Document 5).

PRIOR ART DOCUMENTS

Patent Documents

Patent Document 1: Japanese Unexamined Patent Application, First Publication No. 2005-276410
Patent Document 2: Japanese Unexamined Patent Application, First Publication No. 2004-310910
Patent Document 3: Japanese Unexamined Patent Application, First Publication No. Hei 7-244831
Patent Document 4: Japanese Unexamined Patent Application, First Publication No. 2004-22138
Patent Document 5: Japanese Unexamined Patent Application, First Publication No. 2007-272990

SUMMARY OF THE INVENTION

Problems to be Solved by the Invention

There is still a demand for realizing a higher recording density of the magnetic recording medium, and further improvement in the characteristics of the magnetic recording medium is demanded. More specifically, to improve the recording density of the magnetic recording medium, it is required to micronize crystals composing the above-described orientation control layer and to micronize the magnetic particles having the columnar structure formed thereon. Further, to secure the high reliability of the magnetic recording medium, it is essential to enhance a surface smoothness and improve a scratch-resistance of a surface of the magnetic recording medium.

Under these conventional circumstances, the present invention has been proposed, and an object of the present invention is to provide a method for manufacturing a magnetic recording medium capable of keeping a high vertical orientation of the perpendicular magnetic layer to achieve higher recording density thereof, and a magnetic recording/reproducing apparatus including a magnetic recording medium manufactured by using the above-described manufacturing method.

Means for Solving the Problems

The present invention provides the following means.
(1) A method for manufacturing a magnetic recording medium including at least a non-magnetic substrate, a soft magnetic underlayer, an orientation control layer that controls an orientation of an immediate upper layer, and a perpendicular magnetic layer in which a magnetization easy axis is mainly perpendicularly oriented with respect to the non-magnetic substrate so as to be laminated one another on the non-magnetic substrate, characterized in that:

the perpendicular magnetic layer includes two or more magnetic layers, and each layer is subjected to a crystal growth such that each crystal grain composing each magnetic layer forms a columnar crystal continuous in a thickness direction together with the crystal grains composing the orientation control layer, wherein the orientation control layer, formed of a Co—Cr alloy, is formed by reactive sputtering using a mixture of a sputtering gas and nitrogen, thereby causing the Co—Cr alloy to be doped with the nitrogen within a range from 3 atomic % to 15 atomic %.
(2) The method for manufacturing the magnetic recording medium according to (1), wherein the Co—Cr alloy contains Co within a range from 50 atomic % to 80 atomic % and Cr within a range from 20 atomic % to 50 atomic %.
(3) The method for manufacturing the magnetic recording medium according to (1) or (2), wherein the Co—Cr alloy contains at least one or more elements selected from Pt, B, Ta, Mo, Cu, Nd, W, Nb, Sm, Tb, Ru, and Re within a range from 1 atomic % to 10 atomic %.
(4) The method for manufacturing the magnetic recording medium according to any one of (1) through (3), wherein, in a corrugated surface in which a top part of each columnar crystal composing the orientation control layer is formed into a convex, a height from the topmost part of each columnar crystal to a boundary with the next columnar crystal is set to a value of an outer diameter or less of the columnar crystal.
(5) The method for manufacturing the magnetic recording medium according to any one of (1) through (4), wherein the crystal grains composing the orientation control layer are set to have a grain diameter of 5 nm or less.
(6) The method for manufacturing the magnetic recording medium according to any one of (1) through (5), wherein a Ru layer or a second orientation control layer containing Ru as a main component is formed on the orientation control layer.
(7) The method for manufacturing the magnetic recording medium according to any one of (1) through (6), wherein the magnetic layer or the non-magnetic layer has a granular structure.

(8) A magnetic recording/reproducing apparatus, including:
a magnetic recording medium manufactured by the manufacturing method according to any one of (1) through (7), and
a magnetic head for performing recording and reproducing of information with respect to the magnetic recording medium.

Effects of the Invention

As described above, according to the present invention, a fine columnar crystal can be grown continuously in the thickness direction from the orientation control layer to the uppermost layer of the perpendicular magnetic layer, and the surface smoothness in the surface of the magnetic recording medium can be improved by smoothening the top part of each columnar crystal composing the orientation control layer. Further, a scratch resistance in the surface of the magnetic recording medium can be improved.

Therefore, according to the present invention, the magnetic recording medium capable of securing a high vertical orientation of the perpendicular magnetic layer and providing a higher recording density can be manufactured, and also the magnetic recording/reproducing apparatus including the above-described magnetic recording medium can be provided.

BRIEF DESCRIPTION OF THE DRAWINGS

FIG. 2 includes cross-sectional views, each schematically showing a crystal structure of the orientation control layer in which a Co—Cr alloy is doped with N atoms.

FIG. 6 includes photographs of cross-sections of the orientation control layer taken by using an AFM in Example 1.

FIG. 7 includes graphs indicating measurement results of coercive force (FIG. 7A), reverse magnetic domain nucleation magnetic field (FIG. 7B), SNR (FIG. 7C), and BER and BES (FIG. 7D), for each magnetic recording medium in Example 2.

DESCRIPTION OF REFERENCE NUMERALS

1: Non-magnetic substrate
2: Soft magnetic underlayer
3: Orientation control layer 4: Perpendicular magnetic layer
4a: Lower magnetic layer
4b: Intermediate magnetic layer
4c: Upper magnetic layer
5: Protective layer
6: Lubricating layer
7: Non-magnetic layer
7a: Lower non-magnetic layer
7b: Upper non-magnetic layer
8: Second orientation control layer
11: Orientation control layer
11a: Corrugated surface
12 through 14: Magnetic layer or non-magnetic layer
S, S1 through S3: Columnar crystal
41: Oxide
42: Magnetic particle (non-magnetic particle in 7a and 7b)
50: Magnetic recording medium
51: Medium driving section
52: Magnetic head
53: Head driving section
54: Recording/reproducing signal processing system

DETAILED DESCRIPTION OF THE INVENTION

A method for manufacturing the magnetic recording medium and a magnetic recording/reproducing apparatus to which the present invention is applied are described below in detail with reference to the attached drawings.

The drawings used in the following description may be enlarged at portions having features of the present invention for convenience sake, thereby assisting easy understanding of the features of the present invention. That is, a size ratio of each component does not necessarily correspond to the actual size ratio. Materials, sizes, and the like exemplified in the following description are mere examples, and thus the present invention is not necessarily limited thereto but can be modified, as required, and carried out without departing from the spirit and the scope of the present invention.

The present inventors have intensively studied so as to achieve the above object and found a method for manufacturing a magnetic recording medium in which crystal grains composing the orientation control layer are micronized in order to improve the vertical orientation of the multi-layered magnetic layer and micronize magnetic particles thereof.

More specifically, the method for manufacturing the magnetic recording medium to which the present invention is applied is characterized in that the magnetic recording medium includes a soft magnetic underlayer, an orientation control layer that controls an orientation of an immediate upper layer, and a perpendicular magnetic layer in which a magnetization easy axis is oriented mainly perpendicularly to a non-magnetic substrate so as to be laminated on each other, wherein the perpendicular magnetic layer includes two or more magnetic layers, and, when each layer is subjected to a crystal growth such that each crystal grain composing each magnetic layer forms a columnar crystal continuous in a thickness direction together with the crystal grains composing the orientation control layer, the orientation control layer, formed of a Co—Cr alloy, is formed into a film by the reactive sputtering using a mixture of the sputtering gas and nitrogen to cause the Co—Cr alloy to be doped with the nitrogen within a range from 3 atomic % to 15 atomic %.

Figure 1:
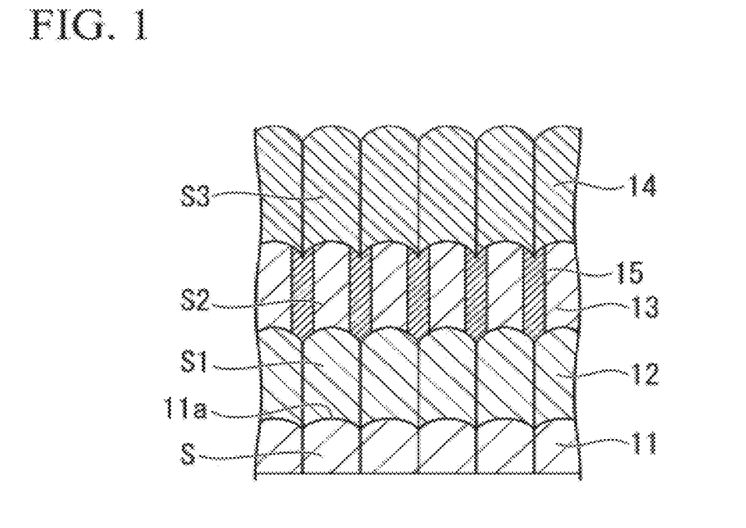
FIG. 1 is a cross-sectional view showing a state where columnar crystals composing each layer when magnetic layers or non-magnetic layers are laminated on each other on a corrugated surface of an orientation control layer grow perpendicular to a surface of a substrate.

As shown in FIG. 1, an orientation control layer 11 is provided with a corrugated surface 11a in which a top part of each columnar crystal S composing the orientation control layer 11 is formed into a dome-like convex part and each crystal grain of a magnetic layer (or a non-magnetic layer) 12 grows in a thickness direction from the corrugated surface 11a to be formed into a columnar crystal S1. The crystal grains of the non-magnetic layer (or magnetic layer) 13 formed on the columnar crystal S1 and the uppermost magnetic layer 14 also epitaxially grow into columnar crystals S2 and S3 which are continuous from the columnar crystal S1.

As described above, in a case where the magnetic layers 12 through 14 are laminated, crystal grains composing each of the magnetic layers 12 through 14 are formed into columnar crystals S1 through S3 continuous from the orientation control layer 11 to the uppermost magnetic layer 14 to repeat the epitaxial growth. A layer 13 shown in FIG. 1 has a granular structure. An oxide 15 is formed around each columnar crystal S2 which forms the layer 13.

Therefore, if the crystal grains of the orientation control layer 11 are micronized, each columnar crystal S composing the orientation control layer 11 can be made denser and the columnar crystals S1 through S3 of the respective layers 12 through 14 which grow into a columnar shape in the thickness direction from the top part of the respective columnar crystals S also can be made denser.

The inventor has conducted studies as to micronization of the crystal grains made of Co—Cr alloy by using various reaction gases when the orientation control layer 11 is formed of the Co—Cr alloy and formed into a film by the reactive sputtering. As a result thereof, the inventor found that an effect can be produced such that the crystal grains made of the Co—Cr alloy are micronized and growing surfaces thereof are made smoother by mixing the sputtering gas with nitrogen.

An inert gas such as an argon gas, a neon gas, and a xenon gas is typically used as the sputtering gas. In a case where the reactive sputtering is used for a film formation processing of the magnetic recording medium, the sputtering gas mainly used is a high reaction gas such as an oxygen gas, a hydrogen gas, a halogen gas, and a water gas. Low-reactive nitrogen gas is seldom used as the sputtering gas.

To the contrary, in the present invention, the sputtering gas of a mixture of the above-described inert gas and the nitrogen is used. In this case, since the nitrogen covers a surface of a target, the target itself reacts or a particle sputtered by the sputtering process is bonded to nitrogen, and allowing the crystal grain made of Co—Cr alloy containing the nitrogen to epitaxially grow in the thickness direction. Accordingly, the columnar crystal is formed.

The inventor has further conducted intensive studies and found that, in a case where the Co—Cr alloy is doped with the nitrogen (N atoms) within a range from 3 atomic % to 15 atomic %, each columnar crystal S composing the orientation control layer 11 can be made denser by the micronized crystal grains while the nucleus generation density in the surface of growing the crystal grains made of Co—Cr alloy that contains the N atoms is made denser. Further, the inventor found that the top part of each columnar crystal S composing the orientation control layer 11 (i.e., growing surface of crystal grains) is made smoother and the columnar crystals S1 through S3 of the respective layers 12 through 14 which grow in the thickness direction from the top part of the respective columnar crystals S are made denser, and being able to smoothen the top part. Thus, the present invention has been completed.

In a case where the orientation control layer 11 in which the Co—Cr alloy is doped with the nitrogen (N atoms) is formed by the reactive sputtering using a mixture of the sputtering gas and the nitrogen, a difference of the crystal structure of the orientation control layer 11 caused by a difference of a doping amount of the N atoms is studied. A result thereof is schematically shown in FIGS. 2A through 2C.

Figure 2A:
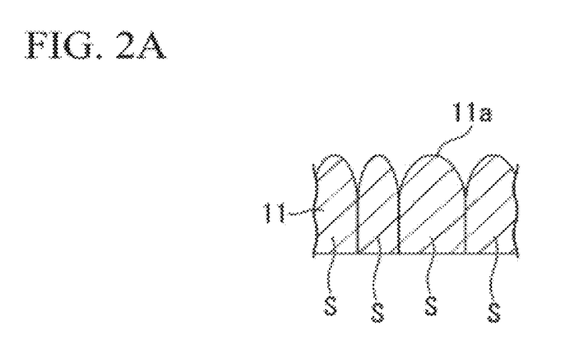
FIG. 2A shows a case where the Co—Cr alloy is doped with the N atoms of less than 3 atomic %.
Figure 2B:
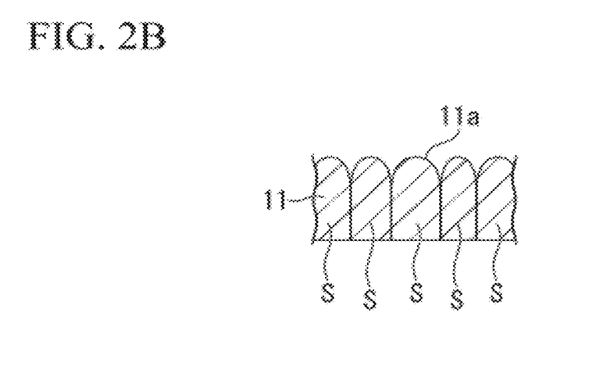
FIG. 2B shows a case where the Co—Cr alloy is doped with the N atoms of a range from 3 atomic % to 15 atomic %.
Figure 2C:
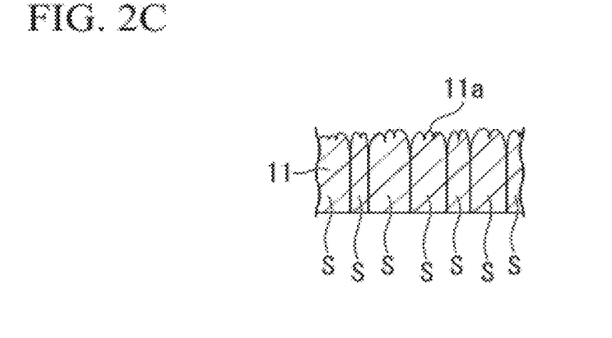
FIG. 2C shows a case where the Co—Cr alloy is doped with N atoms of greater than 15a atomic %, respectively.

FIG. 2A shows a case where the Co—Cr alloy is doped with N atoms of less than 3 atomic %. FIG. 2B shows a case where the Co—Cr alloy is doped with N atoms of a range from 3 atomic % to 15 atomic %. FIG. 2C shows a case where the Co—Cr alloy is doped with N atoms of more than 15a atomic %.

As shown in FIG. 2A, in a case where the doping amount of N atoms doping to the Co—Cr alloy is less than 3 atomic %, the effect of micronization of the crystal grains made of the Co—Cr alloy that contains the N atoms and the effect of smoothening of the top part (i.e., growing surface of crystal grains) of each columnar crystal S composing the orientation control layer 11 are hardly produced. Instead, sizes of the columnar crystals S vary and the height from the topmost part of each columnar crystal S to the boundary with the next columnar crystal S becomes larger.

On the other hand, in a case where the doping amount of N atoms doping to the Co—Cr alloy is greater than 15 atomic %, the micronization of the crystal grains made of the Co—Cr alloy that contains the N atoms develops, but diameters of particles vary widely and reduction of a crystal density is observed due to deterioration of crystallizability of each columnar crystal S. However, no remarkable development is observed in the smoothening of the top part (i.e., growing surface of crystal grains) of each columnar crystal S composing the orientation control layer 11 and the surface is rough due to the deterioration of the crystallizability of the columnar crystal S.

Contrary to the above, as in the case of the present invention, in a case where the doping amount of the N atoms doping to the Co—Cr alloy is set to a range from 3 atomic % to 15 atomic %, the crystal grains made of the Co—Cr alloy that contains the N atoms can be micronized and the density of each columnar crystal S composing the orientation control layer 11 can be made denser, as well as the top part (i.e., growing surface of crystal grains) of each columnar crystal S being made smoother.

Figure 3:
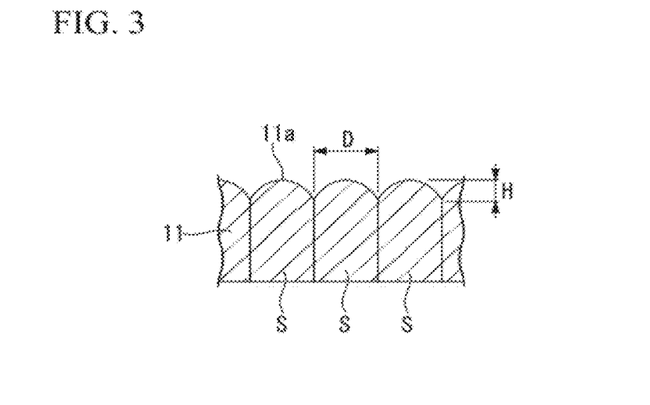
FIG. 3 is a cross-sectional view schematically showing crystal structures of the orientation control layer to which the present invention is applied.

Specifically, in the present invention, as schematically shown in FIG. 3, in the corrugated surface 11a having a convex at the top part of each columnar crystal S composing the orientation control layer 11, it is preferable to set the height H from the topmost part of each columnar crystal S to the boundary with the next columnar crystal to a value of an outer diameter D or less of the columnar crystal S.

Accordingly, the corrugated surface 11a of the orientation control layer 11 can be made smoother to a level sufficiently improving the surface smoothness of the surface of the manufactured magnetic recording medium as well as enhancing a scratch resistance of the surface of the magnetic recording medium. The height H from the topmost part of each columnar crystal S to the boundary with the next columnar crystal and the outer diameter D of the columnar crystal S can be measured by an AFM.

In the present invention, it is preferable that the above-described Co—Cr alloy contain Co in a range from 50 atomic % to 80 atomic % and Cr in a range from 20 atomic % to 50 atomic %. The above-described optimization of the composition range of the Co—Cr alloy enables the micronization of the crystal grains of the orientation control layer 11. As a result thereof, each columnar crystal S composing the orientation control layer 11 is made denser as well as the top part (i.e., growing surface of crystal grains) of each columnar crystal S being made smoother.

In the present invention, it is preferable that the Co—Cr alloy contain at least one element selected from Pt, B, Ta, Mo, Cu, Nd, W, Nb, Sm, Tb, Ru, and Re in a range from 1 atomic % to 10 atomic %. With the above composition, the crystal grains of the orientation control layer 11 can be further micronized without deteriorating the crystallizability thereof.

In order to smoothen the top part of each columnar crystal S composing the orientation control layer 11 or to form it into a suitable dome-like shape, each crystal grain composing the orientation control layer 11 is preferably made to have a grain diameter of 5 nm or less, more preferably, 3 nm or less.

In the present invention, as a condition suitable for forming the above-described orientation control layer 11, pressure of the sputtering gas upon performing the reactive sputtering is preferably set to a range between 0.1 and 10 Pa, more preferably, between 0.5 and 5 Pa.

A blend ratio of the inert gas and the nitrogen gas in the sputtering gas depends on, for example, a shape of a film formation room, the type of the inert gas, the gas pressure upon film formation, a distance between the substrate and the target, and temperature of the substrate upon film formation, so that it is difficult to specify a preferable range of blend of the inert gas and the nitrogen gas. Therefore, it is preferable to optimize the blend ratio by analyzing the doping amount of N atoms contained in the Co—Cr alloy after the film formation thereof by using the XPS and the like. The blend ratio of the nitrogen gas under a film formation condition by using a typical film formation apparatus is preferably in a range between 0.05 and 30 volume percent, more preferably, between 0.1 and 15 volume percent.

The orientation control layer 11 preferably has a thickness of 5 nm or more in order to make the top part of each columnar crystal S composing the orientation control layer 11 smoother or to form it into a suitable dome-shape. However, if the orientation control layer 11 becomes too thick, the below-described magnetic coupling between the soft magnetic underlayer 4 and the magnetic head becomes weaker, thereby inviting deterioration of the OW characteristics. Consequently, a more preferable thickness of the orientation control layer 3a is within a range from 8 nm to 20 nm.

Figure 4:
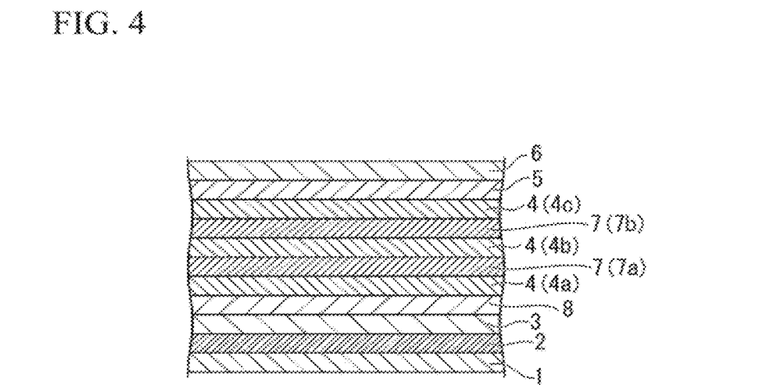
FIG. 4 is a cross-sectional view showing an example of the magnetic recording medium manufactured by applying the present invention.

FIG. 4 shows an example of the magnetic recording medium manufactured by applying the present invention.

As shown in FIG. 4, the magnetic recording medium is configured such that a soft magnetic underlayer 2, a first orientation control layer 3, a second orientation control layer 8, a perpendicular magnetic layer 4, and a protective layer 5 are laminated sequentially on a non-magnetic substrate 1 and, further, a lubricating layer 6 is provided on the laminated layer.

The perpendicular magnetic layer 4 includes three layers of a lower magnetic layer 4a, an intermediate magnetic layer 4b, and an upper magnetic layer 4c in this order from a side of a non-magnetic substrate 1 and further includes a non-magnetic layer 7a between the magnetic layer 4a and the magnetic layer 4b and a non-magnetic layer 7b between the magnetic layer 4b and the magnetic layer 4c. Accordingly, the perpendicular magnetic layer 4 has a configuration in which the magnetic layers 4a through 4c and the non-magnetic layers 7a and 7b are laminated alternately.

Although not shown, crystal grains composing each of the magnetic layers 4a through 4c and the non-magnetic layers 7a and 7b form a columnar crystal continuously in the thickness direction together with the crystal grains composing the first orientation control layer 3.

Examples of the non-magnetic substrate 1 include a metal substrate made of a metal material such as aluminum and aluminum alloy and a non-metal substrate made of a non-metal material such as glass, ceramic, silicon, silicon carbide, and carbon. Another example of the non-magnetic substrate 1 includes a substrate formed such that a NiP layer or a NiP alloy layer is formed on a surface of the metal substrate or the non-metal substrate by, for example, plating or sputtering.

Examples of the glass substrate include an amorphous glass-made substrate or a crystallized glass-made substrate. Examples of the amorphous glass include a generalized soda-lime glass and an aluminosilicate glass. Examples of the crystallized glass include a lithium-based crystallized glass. Examples of the materials of the ceramic substrate include a sintered body containing generalized aluminum oxide, aluminum nitride, and silicon nitride as a main component or a fiber-reinforced sintered body thereof.

Corrosion of the non-magnetic substrate 1 may advance by being brought into contact with the soft magnetic underlayer 2 containing Co or Fe as a main component due to an adverse effect of an absorption gas on a surface thereof and moisture and dispersion of substrate component. In this case, it is preferable to provide a bonding layer between the non-magnetic substrate 1 and the soft magnetic underlayer 2. With this structure, an adverse effect of an absorption gas on a surface thereof and moisture and dispersion of substrate component can be suppressed. A material of the bonding layer can be selected, as required, from, for example, Cr, a Cr alloy, Ti, and a Ti alloy. The preferable thickness of the bonding layer is 2 nm (30 Å) or more.

The soft magnetic underlayer 2 is provided for the purpose of enlarging a vertical component of the magnetic flux generated from the magnetic head with respect to the surface of the substrate and fixing more securely a magnetization direction of the perpendicular magnetic layer 4, in which information is recorded, in a direction vertical to the non-magnetic substrate 1. The above effect becomes more remarkable in a case where a single-pole type head for perpendicular recording is used as a magnetic head for recording and reproducing.

The soft magnetic material containing, for example, Fe, Ni, and Co may be used for forming the soft magnetic underlayer 2. More specifically, the soft magnetic material may be made of, for example, Co—Fe-based alloy (e.g., CoFeTaZr and CoFeZrNb), Fe—Co-based alloy (e.g., FeCo and FeCoV), Fe—Ni-based alloy (e.g., FeNi, FeNiMo, FeNiCr, and FeNiSi), Fe—Al-based alloy (e.g., FeAl, FeAlSi, FeAlSiCr, FeAlSiTiRu, and FeAlO), Fe—Cr-based alloy (e.g., FeCr, FeCrTi, and FeCrCu), Fe—Ta-based alloy (e.g., FeTa, FeTaC, and FeTaN), Fe—Mg-based alloy (e.g., FeMgO), Fe—Zr-based alloy (e.g., FeZrN), Fe—C-based alloy, Fe—N-based alloy, Fe—Si-based alloy, Fe—P-based alloy, Fe—Nb-based alloy, Fe—Hf-based alloy, or Fe—B-based alloy.

The soft magnetic underlayer 2 preferably includes two soft magnetic films and more preferably includes a Ru film between the two soft magnetic films. The film thickness of the Ru film is adjusted within a range between 0.4 and 1.0 nm or a range between 1.6 and 2.6 nm. Accordingly, the two soft magnetic films come to have an AFC structure which enables suppression of a so-called spike noise.

Preferably, the second orientation control layer 8 is provided between the first orientation control layer 3 and the perpendicular magnetic layer 4. In this case, at an initial portion of the perpendicular magnetic layer 4 provided immediately above the first orientation control layer 3, turbulence of the crystal growth tends to occur which becomes a factor of noise. A turbulent portion of the initial portion is replaced with the second orientation control layer 8, thereby enabling suppression of the occurrence of noise.

A material to form the second orientation control layer 8 preferably has, but is not limited to, an hcp structure, an fcc structure, or an amorphous structure. Preferably, the second orientation control layer 8 is made of a Ru-based alloy, a Ni-based alloy, a Co-based alloy, a Pt-based alloy, or a Cu-based alloy. More preferably, the second orientation control layer 8 is made of a Ru or an alloy containing Ru as the main component. The second orientation control layer 8 preferably has a thickness of a range between 5 nm or more and 30 nm or less.

The lower magnetic layer 4a and the intermediate magnetic layer 4b among the layers composing the perpendicular magnetic layer 4 contain Co as a main component and are made of a material further containing oxide 41. Preferable examples of the oxide 41 include Cr oxide, Si oxide, Ta oxide, Al oxide, Ti oxide, Mg oxide, and Co oxide. More specifically, $TiO_2$, $Cr_2O_3$, and $SiO_2$ can be used suitably. The upper magnetic layer 4a is preferably made of a complex oxide in which two or more oxides are added. More specifically, $Cr_2O_3$—$SiO_2$, $Cr_2O_3$—$TiO_2$, or $Cr_2O_3$—$SiO_2$—$TiO_2$, and the like can be used suitably.

Preferably, the magnetic layers 4a and 4b contain magnetic particles (i.e., crystal grains having magnetic properties) 42 dispersed therein. Preferably, each of the magnetic particles 42 has a columnar structure which pierces through the magnetic layers 4a and 4b and further the upper magnetic layer 4c in an up-and-down direction. With the above-described structure, magnetic particles 42 of the magnetic layer 4a can have a suitable orientation and crystallizability. As a result thereof, a signal/noise ratio (S/N ratio) suitable for high-density recording can be obtained.

In order to obtain such a structure, a content of the oxide 41 and a film formation condition of each of the magnetic layers 4a and 4b are important factors. That is, a preferable range of the content of the oxide 41 is within a range between 3 mol % or more and 18 mol % or less with respect to a total molar quantity calculated considering the alloy containing Co, Cr, Pt and the like as a type of the chemical compound, and the alloy composing the magnetic particles 42. A more preferable range is between 6 mol % or more and 13 mol % or less.

With the above-described range of the content of the oxide 41, the oxide 41 is deposited around each magnetic particle 42 upon forming each of the magnetic layers 4a and 4b, thereby enabling isolation and micronization of the magnetic particle 42. On the other hand, in a case where the content of the oxide 41 exceeds the above-described range, the oxide 41 remains in the magnetic particle 42, which invites impairment of the orientation and the crystallizability of the magnetic particle 42. Further, the oxide 41 is deposited on a top and a bottom of the magnetic particle 42. As a result thereof, unpreferably, the columnar structure in which the magnetic particle 42 pierces through the magnetic layers 4a through 4c in the up-and-down direction is not formed. In a case where the content of the oxide 41 is less than the above-described range, the separation and the micronization of the magnetic particle 42 become insufficient to invite an increase of noise upon recording and reproducing. As a result thereof, unpreferably, the signal/noise ratio (S/N ratio) suitable for high-density recording cannot be obtained.

A preferable range of the content of Cr within each of the magnetic layers 4a and 4b is a range between 4 atomic % or more and 19 atomic % or less. More preferable range is between 6 atomic % or more and 17 atomic % or less. The range of the content of Cr is set to the above value for the below-described reasons. That is, a magnetic anisotoropic constant Ku of the magnetic particle 42 is not caused to be lowered too much, and a high magnetic field can be kept, resulting in obtaining the recording/reproducing characteristics suitable for the high-density recording and satisfactory thermal fluctuation characteristics.

On the other hand, in a case where the content of Cr exceeds the above-described range, since the magnetic anisotoropic constant Ku of the magnetic particle 42 becomes smaller, the thermal fluctuation characteristics is deteriorated and the crystallizability and the orientation of the magnetic particle 42 are lowered, resulting in causing deterioration of the recording/reproducing characteristics. Therefore, it is not preferable that the content of Cr exceed the above range. Further, in a case where the content of Cr is less than the above range, since the magnetic anisotoropic constant Ku of the magnetic particle 42 is high, a perpendicular coercivity becomes too high. As a result thereof, a satisfactory recording cannot be achieved by the magnetic head upon recording data, resulting in showing recording characteristics that are not suitable for the high-density recording (OW). Therefore, it is not preferable that the content of Cr be less than the above-described range.

Examples of materials suitable for each of the magnetic layers 4a and 4b include alloy-based materials such as (CoCrPt)—(Ta$_2$O$_s$), (CoCrPt)—(Cr$_2$O$_3$)—(TiO$_2$), (CoCrPt)—(Cr$_2$O$_3$)—(SiO$_2$), (CoCrPt)—(Cr$_2$O$_3$)—(SiO$_2$)—(TiO$_2$), (CoCrPtMo)—(TiO), (CoCrPtW)—(TiO$_2$), (CoCrPtB)—(Al$_2$O$_3$), (CoCrPtTaNd)—(MgO), (CoCrPtBCu)—(Y$_2$O$_3$), (CoCrPtRu)—(SiO$_2$) in addition to 90(Co14Cr18Pt)-10(SiO$_2$) {molality of 90 mol % calculated considering the magnetic particle made of Cr content of 14 atomic %, Pt content of 18 atomic %, and Co as remaining portion, as a chemical compound and an oxide composition containing SiO$_2$ of 10 mol %, the same hereinafter}, 92(Co10Cr16Pt)-8(SiO$_2$), and 94(Co8Cr14Pt4Nb)-6(Cr$_2$O$_3$).

Preferably, the upper magnetic layer 4c is made of a material containing Co, but no oxide, as a main component. More preferably, the upper magnetic layer 4c has a structure such that the magnetic particle 42 within the layer epitaxially grows into a column shape from the magnetic particle 42 within the magnetic layer 4a. In this case, it is preferable that the magnetic particle 42 of each of the magnetic layers 4a through 4c epitaxially grow into the column shape in a one-for-one manner in each layer. Further, since the magnetic particle 42 of the intermediate magnetic layer 4b epitaxially grows from the magnetic particle 42 within the lower magnetic layer 4a, the magnetic particle 42 of the intermediate magnetic layer 4b is micronized, resulting in improvement of the crystallizability and the orientation thereof.

Preferable content of Cr within the magnetic layer 4c is a range between 10 atomic % or more and 24 atomic % or less. With the above-described range of the content of Cr, an output can be satisfactorily secured when reproducing data and further suitable thermal fluctuation characteristics can be obtained. On the other hand, in a case where the content of Cr exceeds the above-described range, magnetization of the magnetic layer 4c becomes too small. Therefore, the content of Cr exceeding the above-described range is not preferable. In a case where the content of Cr is less than the above-described range, the separation and the micronization of the magnetic particles 42 do not occur to a satisfactory level. Therefore, noise upon recording and reproducing increases and thus the signal/noise ratio (S/N ratio) suitable for high-density recording cannot be obtained. Therefore, the content of Cr less than the above-described range is not preferable.

The magnetic layer 4c may be made of a material containing Pt in addition to Co or Cr. Preferable content of Pt within the magnetic layer 4c is within a range between 8 atomic % or more and 20 atomic % or less. In a case where the content of Pt is within the above-described range, a satisfactory coercive force suitable for high recording density can be obtained and further a high reproduction output upon recording and reproducing can be kept. As a result thereof, the recording/reproducing characteristics and the thermal fluctuation characteristics suitable for high-density recording can be obtained.

On the other hand, in a case where the content of Pt exceeds the above-described range, a phase of fcc structure is likely to be formed within the magnetic layer 4c and thus the crystallizability and the orientation may be impaired. Thus the content of Pt exceeding the above-described range is not preferable. Further, in a case where the content of Pt is less than the above-described range, the magnetic anisotoropic constant Ku for obtaining the thermal fluctuation characteristics suitable for high-density recording cannot be obtained. Thus, the range of the content of Pt less than the above-described range is not preferable.

The magnetic layer 4c can contain one or more elements selected from B, Ta, Mo, Cu, Nd, W, Nb, Sm, Tb, Ru, Re, and Mn in addition to Co, Cr, and Pt. By containing the above-described element, micronization of the magnetic particles 42 can be accelerated or the crystallizability and the orientation thereof can be improved. Accordingly, the recording/reproducing characteristics and the thermal fluctuation characteristics more suitable for high-density recording can be obtained.

Preferably, a total content of the element(s) is 16 atomic % or less. On the other hand, in a case where the total content of the element(s) exceeds 16 atomic %, since a phase other than hcp phase is formed within the magnetic particle 42, the crystallizability and the orientation of the magnetic particle 42 are disrupted. As a result thereof, the recording/reproducing characteristics and the thermal fluctuation characteristics suitable for high-density recording cannot be obtained. Therefore, the total content of element(s) exceeding the above level is not preferable.

Examples of materials suitable for the magnetic layer 4c can include CoCrPt-based material and CoCrPtB-based material. In a case of the CoCrPtB-based material, the total content of Cr and B is preferably in a range between 18 atomic % or more and 28 atomic % or less.

Preferable examples of a CoCrPt-based material suitable for the magnetic layer 4c include Co14 to 24Cr8 to 22Pt {Cr content of 14 to 24 atomic %, Pt content of 8 to 22 atomic %, and remaining portion of Co}. Preferable examples of a CoCrPtB-based material suitable for the magnetic layer 4c include Co10 to 24Cr8 to 22Pt0 to 16B {Cr content of 10 to 24 atomic %, Pt content of 8 to 22 atomic %, B content of 0 to 16 atomic %, and remaining portion of Co}. Examples of a CoCrPtTa-based material suitable for the magnetic layer 4c include Co10 to 24Cr8 to 22Pt1 to 5Ta {Cr content of 10 to 24 atomic %, Pt content of 8 to 22 atomic %, Ta content of 1 to 5 atomic %, and remaining portion of Co}. Examples of a CoCrPtTaB-based material suitable for the magnetic layer 4c include Co10 to 24Cr8 to 22Pt1 to 5Ta1 to 10B {Cr content of 10 to 24 atomic %, Pt content of 8 to 22 atomic %, Ta content of 1 to 5 atomic %, B content of 1 to 10 atomic %, and remaining portion of Co}. In addition to the above, examples of the materials suitable for the magnetic layer $4c$ can include a CoCrPtBNd-based material, a CoCrPtTaNd-based material, a CoCrPtNb-based material, a CoCrPtBW-based material, a CoCrPtMo-based material, a CoCrPt-CuRu-based material, and a CoCrPtRe-based material.

Preferably, the perpendicular magnetic layer 4 has a thickness of a range between 5 and 20 nm. If the thickness of the perpendicular magnetic layer 4 is less than the above-described range, it is difficult to obtain sufficient reproduction output and thus the thermal fluctuation characteristics are also lowered. Further, in a case where the thickness of the perpendicular magnetic layer 4 exceeds the above-described range, the magnetic particles within the perpendicular magnetic layer 4 overgrow, the noise upon recording and reproducing increases, and the recording/reproducing characteristics represented by the signal/noise ratio (S/N ratio) and the recording characteristics (OW) are deteriorated. Therefore, the thickness of the perpendicular magnetic layer 4 exceeding the above-described range is not preferable.

Preferably, the non-magnetic layers $7a$ and $7b$ provided between the magnetic layers $4a$ through $4c$ composing the perpendicular magnetic layer 4 have a structure such that metal particles of the above-described alloys are dispersed within oxide, metal nitride, or metal carbide. More preferably, the non-magnetic layers $7a$ and $7b$ have a columnar structure in which the metal particle pierces through the non-magnetic layers $7a$ and $7b$ in the up-and-down direction. To obtain such a structure, it is preferable to use an alloy material containing oxide, metal nitride, or metal carbide. More specifically, for example, $SiO_2$, $Al_2O_3$, $Ta_2O_5$, $Cr_2O_3$, $MgO$, $Y_2O_3$, and $TiO_2$ may be used as the oxide. For example, $AlN$, $Si_3N_4$, $TaN$, $CrN$ may be used as the metal nitride. For example, $TaC$, $BC$, and $SiC$ may be used as the metal carbide. Further, for example, $CoCr$—$SiO_2$, $CoCr$—$TiO_2$, $CoCr$—$Cr_2O_3$, $CoCrPt$—$Ta_2O_5$, $Ru$—$SiO_2$, $Ru$—$Si_3N_4$, and $Pd$—$TaC$ can also be used.

Preferably, a content of the oxide, the metal nitride, or the metal carbide contained in the non-magnetic layers $7a$ and $7b$ provided between the magnetic layers $4a$ through $4c$ composing the perpendicular magnetic layer 4 is a content which does not impair the crystal growth and the crystalline orientation of the perpendicular magnetic layer 4. Preferable content of the oxide, the metal nitride, or the metal carbide is a range between 4 mol % or more and 30 mol % or less with respect to the alloy.

In a case where the content of the oxide, the metal nitride, or the metal carbide contained in the non-magnetic layers $7a$ and $7b$ exceeds the above-described range, the oxide, the metal nitride, or the metal carbide remains within the metal particle to impair the crystallizability and the orientation of the metal particle. Further, the oxide, the metal nitride, or the metal carbide deposits on a top and a bottom of the metal particle, so that the columnar structure in which the metal particle pierces through the non-magnetic layers $7a$ and $7b$ in the up-and-down direction is hard to be formed. As a result thereof, the crystallizability and the orientation of the magnetic layers $4b$ and $4c$, respectively, formed on the non-magnetic layers $7a$ and $7b$ is likely to be impaired. Therefore, the content of the oxide, the metal nitride, or the metal carbide contained in the non-magnetic layers $7a$ and $7b$ exceeding the above-described range is not preferable. On the other hand, in a case where the content of the oxide, the metal nitride, or the metal carbide contained in the non-magnetic layers $7a$ and $7b$ is less than the above-described range, a good effect cannot be obtained according to the addition of the oxide, the metal nitride, or the metal carbide. Therefore, the content of the oxide, the metal nitride, or the metal carbide contained in the non-magnetic layers $7a$ and $7b$ less than the above-described range is not preferable.

The protective layer 5 prevents the perpendicular magnetic layer 4 from the corrosion thereof as well as prevents a surface of the magnetic recording medium from being damaged by the magnetic head when the magnetic head contacts the magnetic recording medium. Any conventionally known material can be used to form the protective layer 5. For example, the material of the protective layer 5 can contain C, $SiO_2$, or $ZrO_2$. Preferably, the protective layer 5 has a thickness of a range between 1 and 10 nm in view of the high recording density since a distance between the magnetic head and the magnetic recording medium can be made narrower.

Preferable examples of the lubricant to be used in the lubricating layer 6 include a perfluoropolyether, fluorinated alcohol, and fluorinated carboxylic acids.

In the present invention, when manufacturing the magnetic recording medium shown in FIG. 4, the first orientation control layer 3 is formed of the Co—Cr alloy and is formed into a film by the reactive sputtering by using a sputtering gas containing nitrogen, thereby causing the Co—Cr alloy to be doped with the nitrogen within a range from 3 atomic % to 15 atomic %.

Accordingly, a fine columnar crystal can be grown continuously in the thickness direction from the first orientation control layer 3 to the uppermost layer of the perpendicular magnetic layers 4. Further, by making the top part of each columnar crystal composing the first orientation control layer 3 smoother, the surface smoothness of the surface of the magnetic recording medium can be improved. Still further, the scratch resistance of the surface of the magnetic recording medium can be improved.

In view of the above, according to the present invention, the magnetic recording medium in which high vertical orientation of the perpendicular magnetic layer 4 can be kept and further possible higher recording density can be achieved can be manufactured. Also, the magnetic recording/reproducing apparatus with the magnetic recording medium can be provided.

Figure 5:
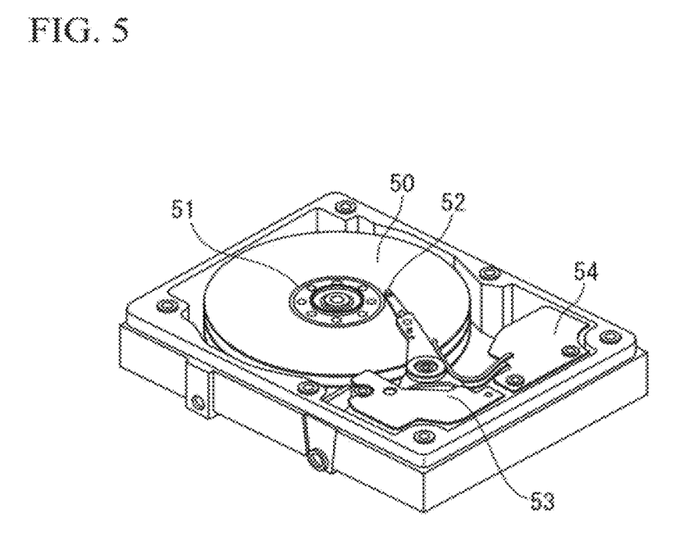
FIG. 5 is a perspective view showing an example of the magnetic recording/reproducing apparatus.

FIG. 5 shows an example of the magnetic recording/reproducing apparatus to which the present invention is applied.

The magnetic recording/reproducing apparatus includes a magnetic recording medium 50 having a structure shown in the above-described FIG. 4, a medium driving section 51 that drives the magnetic recording medium 50 to be rotated, a magnetic head 52 that records information in the magnetic recording medium 50 and reproducing the information thereby, a head driving section 53 that causes the magnetic head 52 to relatively move with respect to the magnetic recording medium 50, and a recording/reproducing signal processing system 54. Further, the recording/reproducing signal processing system 54 is configured such that it can process data input from the outside to transmit a recording signal thereof to the magnetic head 52 and process the reproduced signal from the magnetic head 52 to transmit data thereof to the outside. The magnetic head 52 used in the magnetic recording/reproducing apparatus to which the present invention is applied may be the magnetic head suitable for higher recording density that has a GMR element or the like utilizing a giant magnetoresistive effect (GMR) as a reproducing element.

EXAMPLES

Effects of the present invention will be described in more detail below by way of Examples. It should be noted that the present invention is not limited to the following Examples and modifications may be made without departing from the spirit and the scope of the present invention.

Example 1

In Example 1, as in the conventional way, the orientation control layer made of 75Co-25Cr formed by the sputter deposition using an inert gas as the sputtering gas and, as in the present invention, the orientation control layer made of 90(75Co-25Cr)-10N formed by the reactive sputtering using an inert gas in which sputtering gas is mixed with nitrogen of 1.5 volume percent, 75Co-25Cr being doped with nitrogen (N atoms) by 10 atomic %, are formed so as to have a 10 nm thickness, respectively.

By using an atomic force microscope (AFM), cross-sections of the orientation control layers are observed. The cross-sectional photographs (i.e., AFM photographs) are shown in FIGS. 6A and 6B.

Figure 6A:
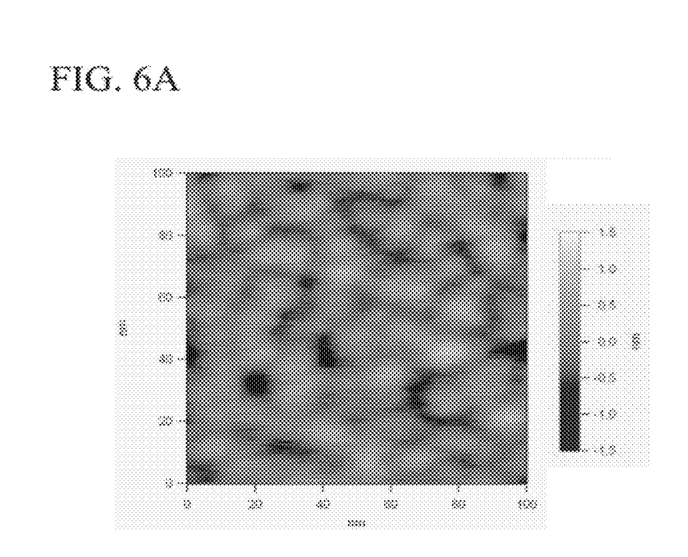
FIG. 6A shows a case where the orientation control layer is formed by using the conventional method.
Figure 6B:
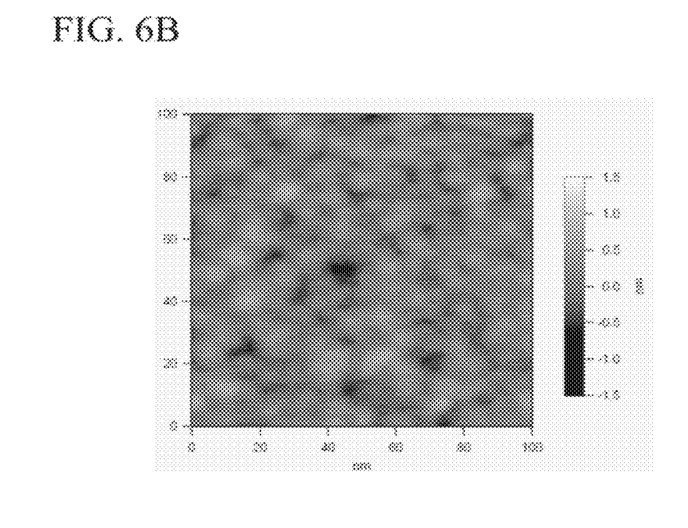
FIG. 6B shows a case where the orientation control layer is formed by using the method of the present invention.
Figure 7A:
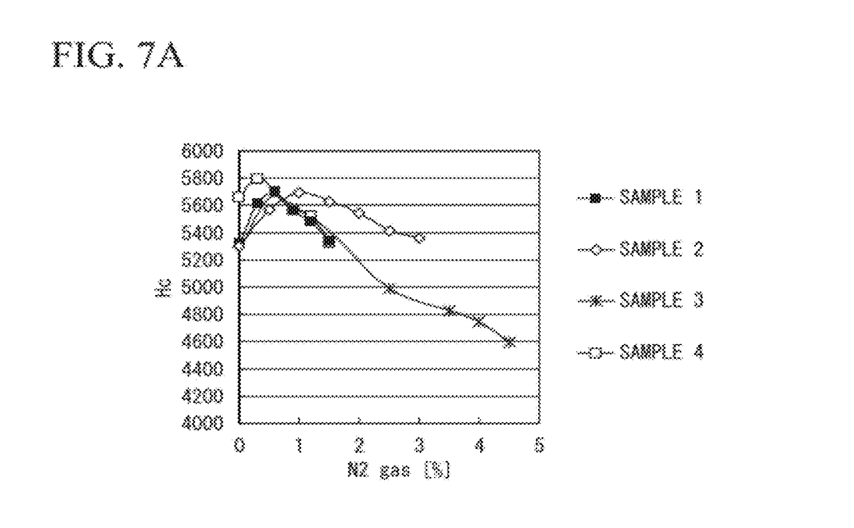
Figure 7B:
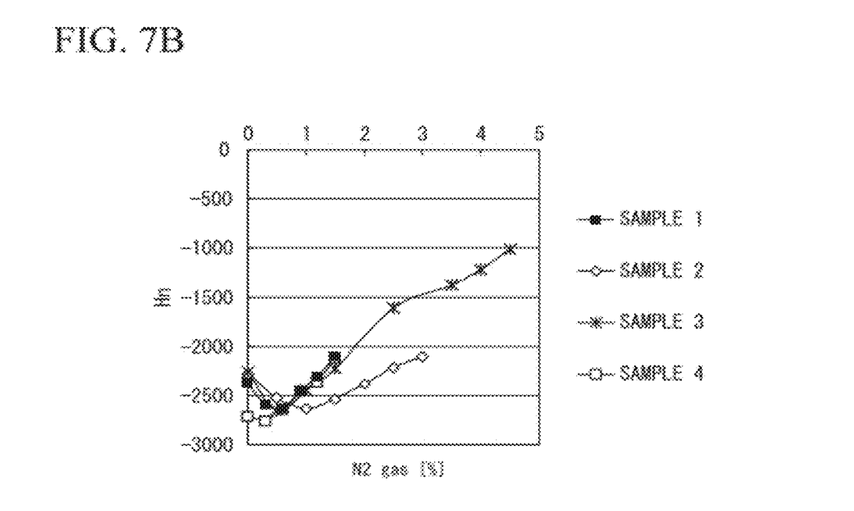
Figure 7C:
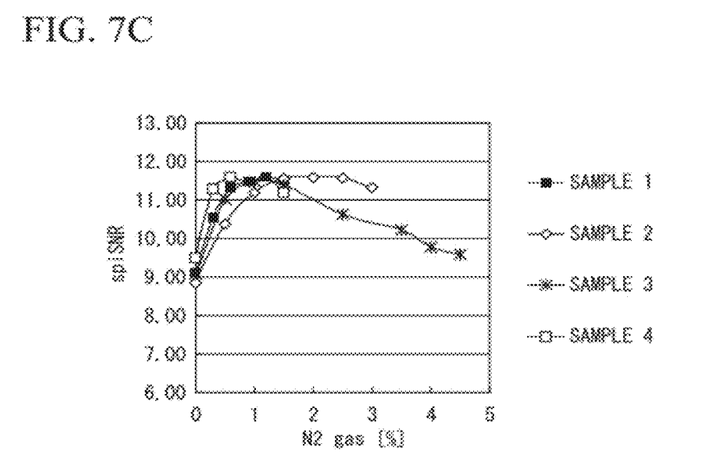
Figure 7D:
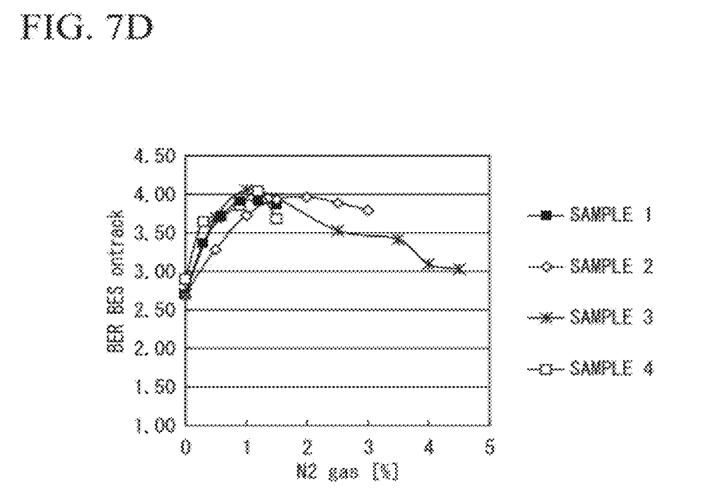

As shown in FIG. 6A, in a case where the orientation control layer was formed by using the conventional method, a surface roughness Ra of the corrugated surface (i.e., growing surface of crystal grains) of the orientation control layer was 0.21 nm, whereas, as shown in FIG. 6B, in a case where the orientation control layer was formed by using the method of the present invention, a surface roughness Ra of the corrugated surface (i.e., growing surface of crystal grains) of the orientation control layer was 0.16 nm.

In a case as shown in FIG. 6A, in the corrugated surface in which the top part of each columnar crystal is formed into a convex, an average height from the topmost part of each columnar crystal to the boundary with the next columnar crystal was 2.0 nm and an average outer diameter of the columnar crystal was 10 nm. On the other hand, in a case as shown in FIG. 6B, in the corrugated surface in which the top part of each columnar crystal is formed into a convex, an average height from the topmost part of each columnar crystal to the boundary with the next columnar crystal was 1.5 nm and an average outer diameter of the columnar crystal was 5 nm.

Therefore, from the above result, it is observed that the crystal grains of the orientation control layer as shown in FIG. 6B are micronized more than the crystal grains of the orientation control layer as shown in FIG. 6A and the growing surface of crystal grains of FIG. 6B is smoother than the other one.

Example 2

In Example 2, a cleaned-up glass substrate (having an outer size of 2.5 inch manufactured by Konica Minolta Holdings, Inc.) is accommodated in a film-depositing chamber of a DC magnetron sputtering device (C-3040 manufactured by Canon-Anelva Co.) and, after evacuating air from the film-depositing chamber to an ultimate pressure of $1 \times 10^{-5}$ Pa, a bonding layer having a 10 nm thickness is formed on the glass substrate by using a Cr target. A soft magnetic layer having a thickness of 25 nm is formed on the bonding layer by using a target of Co-20Fe-5Zr-5Ta {Fe content of 20 atomic %, Zr content of 5 atomic %, Ta content of 5 atomic %, and remaining portion of Co} under a substrate temperature of 100° C. or lower and, after a Ru layer having a thickness of 0.7 nm is formed on the soft magnetic layer, another soft magnetic layer having a thickness of 25 nm, the layer being made of Co-20Fe-5Zr-5Ta, is formed on the Ru layer, thereby forming the soft magnetic underlayer.

Subsequently, a seed layer having a thickness of 5 nm is formed on the soft magnetic underlayer by using a target of Ni-6W {W content of 6 atomic % and remaining portion of Ni}, followed by a formation of the orientation control layer having a thickness of 15 nm on the seed layer. Upon forming the orientation control layer, the reactive sputtering is performed under the conditions of the use of the target of Co-40Cr {Cr content of 40 atomic % and remaining portion of Co} (Sample 1), Co-35Cr {Cr content of 35 atomic % and remaining portion of Co} (Sample 2), Co-30Cr {Cr content of 30 atomic % and remaining portion of Co} (Sample 3), or Co-30Cr-6Mo-1W {Cr content of 30 atomic %, Mo content of 6 atomic %, W content of 1 atomic % and remaining portion of Co} (Sample 4), the use of the sputtering gas of a mixture of an argon gas and a nitrogen gas, a gas pressure of 0.8 Pa, and a plasma electric power of 1000 W. The concentration of the nitrogen gas in the sputtering gas was varied within a range between 0 and 4.5%.

Then, the Ru layer having a thickness of 10 nm is formed as the second orientation control layer under a sputtering pressure of 1.5 Pa. Subsequently, a magnetic layer having a thickness of 9 nm is formed on the second orientation control layer under the condition of the sputtering pressure of 2 Pa, the magnetic layer being made of 91(Co15Cr16Pt)-6(SiO$_2$)-3(TiO$_2$) {Cr content of 15 atomic %, Pt content of 16 atomic % and remaining portion of Co alloy of 91 mol %, oxide composed of SiO$_2$ of 6 mol %, oxide composed of TiO$_2$ of 3 mol %}.

The non-magnetic layer having a thickness of 0.3 nm is formed on the magnetic layer, the non-magnetic layer being made of 88(Co30Cr)-12(TiO$_2$) {Cr content of 30 atomic %, remaining portion of Co alloy of 88 mol % and oxide composed of TiO$_2$ of 12 mol %}, and thereafter, a magnetic layer having a thickness of 6 nm is formed on the non-magnetic layer under the sputtering pressure of 2 Pa, the magnetic layer being made of 92(Co11Cr18Pt)-5(SiO$_2$)-3(TiO$_2$) {Cr content of 11 atomic %, Pt content of 18 atomic %, remaining portion of Co alloy of 92 mol %, oxide composed of SiO$_2$ of 5 mol % and oxide composed of TiO$_2$ of 3 mol %}. Then, a non-magnetic layer made of Ru is formed on the magnetic layer with a thickness of 0.3 nm, and a magnetic layer having a thickness of 7 nm is formed on the non-magnetic layer by using a target being made of Co-20Cr-14Pt-3B {Cr content of 20 atomic %, Pt content of 14 atomic %, B content of 3 atomic % and remaining portion of Co} under the sputtering pressure of 0.6 Pa.

The protective layer having a thickness of 3 nm is formed by the CVD method and, finally, the lubricating layer made of perfluoropolyether is formed thereon by dipping. Accordingly, the magnetic recording medium of each of the samples 1 through 6 is manufactured.

With respect to each magnetic recording medium, the "coercive force (Hc)", the "reverse magnetic domain nucleation magnetic field (Hn)", the "SNR (noise level), the "BER", and the "BES BES ontrack (error rate)" are measured, respectively, in a state where the concentration of the nitrogen gas mixed in the sputtering gas is varied within a range between 0 and 4.5% when the above-described orientation control layer is formed by the reactive sputtering. The measurement results thereof are shown in FIG. 8. N content contained in the orientation control layer of each magnetic recording medium is measured by the XPS.

In FIG. 8, (a) shows the measurement result of the "coercive force (Hc)", (b) shows the measurement result of the "reverse magnetic domain nucleation magnetic field (Hn)", (c) shows the measurement result of the "spi SNR (noise level)", and (d) shows the measurement result of the BER BES ontrack (error rate)", respectively.

Here, the spi SNR represents SNR at a frequency of half of the maximum write frequency and BER BES ontrack represents an error rate (−log(error bit number/total bit number)) measured by using a BES ontrack board manufactured by Guzik Technical Enterprises (USA), respectively.

In a case where the N content contained in the orientation control layer of the magnetic recording medium is measured by the XPS, Co-30Cr is doped with the nitrogen atoms of 7 atomic % according to an addition of nitrogen of 1 volume % to the sputtering gas, Co-35Cr is doped with the nitrogen atoms of 8 atomic %, Co-40Cr is doped with the nitrogen atoms of 9 atomic %, and Co-30Cr-6Mo-1W is doped with the nitrogen atoms of 7 atomic %, respectively.

When a doping amount of the nitrogen (N) atoms to pure chromium (Cr) and pure cobalt (Co) is measured under the same condition, the doping amount was 24 atomic % and 3 atomic %, respectively.

Example 3

In Example 3, the scratch resistance is evaluated with respect to the magnetic recording medium including the orientation control layer made of Co-30Cr-7N {Cr content of 30 atomic %, N content of 7 atomic % and remaining portion of Co} (Example) and the orientation control layer made of Co-30Cr-2N {Cr content of 30 atomic %, N content of 2 atomic % and remaining portion of Co} (Comparative Example).

More specifically, the above measurement was performed by using a SAF tester manufactured by Kubota Comps Co. and an optical surface inspection apparatus (OSA) manufactured by Candela K.K. under the conditions of the number of disk rotations of 5,000 rpm, an air pressure of 100 Torr, at a room temperature, and keeping a state where the head is loaded by using a tester for 2,000 seconds, and, then, the number of scratches was counted by the OSA.

As a result thereof, in the magnetic recording medium of the examples, the number of scratches counted by the OSA was 130, whereas, in the magnetic recording medium of the Comparative Example, the number of scratches counted by the OSA was 850. Namely, the magnetic recording medium of the examples has better scratch resistance.

What is claimed is:

1. A method for manufacturing a magnetic recording medium comprising at least a non-magnetic substrate, a soft magnetic underlayer, an orientation control layer that controls an orientation of an immediate upper layer, and a perpendicular magnetic layer in which a magnetization easy axis is mainly perpendicularly oriented with respect to the non-magnetic substrate so as to be laminated one another on the non-magnetic substrate, characterized in that:

the perpendicular magnetic layer includes two or more magnetic layers, and each layer is subjected to a crystal growth such that each crystal grain composing each magnetic layer forms a columnar crystal continuous in a thickness direction together with the crystal grains composing the orientation control layer, wherein the orientation control layer, formed of a Co—Cr alloy, is formed by reactive sputtering using a mixture of a sputtering gas and nitrogen, thereby causing the nitrogen to be doped in the crystal grains of the Co—Cr alloy within a range from 3 atomic % to 15 atomic %, and wherein, in a corrugated surface in which a top part of each columnar crystal composing the orientation control layer is formed into a convex, a height from the topmost part of each columnar crystal to a boundary with the next columnar crystal is set to a value of an outer diameter or less of the columnar crystal.

2. The method for manufacturing the magnetic recording medium according to claim 1, wherein the Co—Cr alloy contains Co within a range from 50 atomic % to 80 atomic % and Cr within a range from 20 atomic % to 50 atomic %.

3. The method for manufacturing the magnetic recording medium according to claim 1, wherein the Co—Cr alloy contains at least one or more elements selected from Pt, B, Ta, Mo, Cu, Nd, W, Nb, Sm, Tb, Ru, and Re within a range from 1 atomic % to 10 atomic %.

4. The method for manufacturing the magnetic recording medium according to claim 1, wherein the crystal grains composing the orientation control layer are set to have a grain diameter of 5 nm or less.

5. The method for manufacturing the magnetic recording medium according to claim 1, wherein a Ru layer or a second orientation control layer containing Ru as a main component is formed on the orientation control layer.

6. The method for manufacturing the magnetic recording medium according to claim 1, wherein the magnetic layer or the non-magnetic layer has a granular structure.

7. A magnetic recording/reproducing apparatus, comprising:

a magnetic recording medium manufactured by the manufacturing method according to claim 1, and a magnetic head for performing recording and reproducing of information with respect to the magnetic recording medium.

* * * * *